US008199512B2

(12) United States Patent
Kiryu et al.

(10) Patent No.: US 8,199,512 B2
(45) Date of Patent: Jun. 12, 2012

(54) MEMORY CARD CONNECTOR

(75) Inventors: Koichi Kiryu, Shimotakai-gun (JP); Hideo Miyazawa, Shinagawa (JP)

(73) Assignee: Fujitsu Component Limited, Tokyo (JP)

( * ) Notice: Subject to any disclaimer, the term of this patent is extended or adjusted under 35 U.S.C. 154(b) by 365 days.

(21) Appl. No.: 12/507,107

(22) Filed: Jul. 22, 2009

(65) Prior Publication Data

US 2010/0033937 A1 Feb. 11, 2010

(30) Foreign Application Priority Data

Aug. 6, 2008 (JP) ................................ 2008-203311

(51) Int. Cl.
*H05K 1/14* (2006.01)

(52) U.S. Cl. ....................................................... 361/737

(58) Field of Classification Search .................. 361/686, 361/727, 737; 439/374, 377, 631
See application file for complete search history.

(56) References Cited

U.S. PATENT DOCUMENTS

| | | | | |
|---|---|---|---|---|
| 5,365,573 | A * | 11/1994 | Sakamoto et al. | 455/412.1 |
| 5,399,105 | A * | 3/1995 | Kaufman et al. | 439/607.19 |
| 5,946,194 | A * | 8/1999 | Dudas et al. | 361/737 |
| 6,018,461 | A * | 1/2000 | Biermann et al. | 361/737 |
| 6,334,786 | B1 * | 1/2002 | Lee | 439/331 |
| 6,509,876 | B1 * | 1/2003 | Jones et al. | 343/702 |
| 6,604,950 | B2 * | 8/2003 | Maldonado et al. | 439/66 |
| 6,669,487 | B1 * | 12/2003 | Nishizawa et al. | 439/60 |
| 6,699,068 | B2 * | 3/2004 | Wu | 439/541.5 |
| 6,811,434 | B2 * | 11/2004 | Wu | 439/567 |
| 7,214,069 | B2 * | 5/2007 | Rathburn | 439/66 |
| 7,666,034 | B2 * | 2/2010 | Ting | 439/631 |
| 2003/0186589 | A1 * | 10/2003 | Holcombe et al. | 439/631 |
| 2004/0048518 | A1 * | 3/2004 | Ruckerbauer et al. | 439/631 |
| 2004/0092168 | A1 * | 5/2004 | Vadasz et al. | 439/631 |
| 2004/0240187 | A1 * | 12/2004 | Takabatake et al. | 361/752 |
| 2006/0069922 | A1 * | 3/2006 | Jelinek et al. | 713/186 |
| 2006/0164040 | A1 * | 7/2006 | Ohkubo | 320/135 |
| 2006/0205281 | A1 * | 9/2006 | Kikuchi et al. | 439/630 |
| 2009/0004919 | A1 * | 1/2009 | Ting | 439/631 |
| 2011/0124231 | A1 * | 5/2011 | Hamner et al. | 439/631 |

FOREIGN PATENT DOCUMENTS

JP 2008-126492 6/2008

* cited by examiner

*Primary Examiner* — Lisa Lea Edmonds
*Assistant Examiner* — Xanthia C Cunningham
(74) *Attorney, Agent, or Firm* — IPUSA, PLLC

(57) ABSTRACT

A memory card connector, which is mounted on a printed circuit board, includes a radio-communication module, and a card slot arranged with input/output terminals that are connected to the printed circuit board. In the memory card connector, input/output terminals of the radio-communication module are arranged to join the input/output terminals of the card slot, such that the radio-communication module enables the printed circuit board to access an external device via radio communication in a manner equivalent to a manner when the printed circuit board accesses a memory card attached to the card slot.

3 Claims, 8 Drawing Sheets

MEMORY CARD CONNECTOR

BACKGROUND OF THE INVENTION

1. Field of the Invention

This invention generally relates to a memory card connector, and more particularly to a memory card connector which is mounted on electronic equipment, such as a digital camera, for attaching a memory card thereto.

2. Description of the Related Art

Conventionally, an ink-jet printer which includes a card slot and an infrared ray communication part is known. A memory card which stores various items of information therein is detachably attached to the card slot of the ink-jet printer. The infrared ray communication part is provided to receive data from a digital camera via radio communication. For example, Japanese Laid-Open Patent Publication No. 2008-126492 discloses an ink-jet printer of this type.

However, the ink-jet printer of Japanese Laid-Open Patent Publication No. 2008-126492 is arranged to include the infrared ray communication part and the card slot as discrete independent components. Input/output terminals of each of the infrared ray communication part and the card slot are connected to respective pads formed on a printed circuit board, to enable the use of the infrared ray communication part and the card slot. This ink-jet printer is required to have a discrete independent circuit pattern, corresponding to each of the infrared ray communication part and the card slot, on the printed circuit board. The arrangement of the discrete independent circuit patterns on the printed circuit board makes the printed circuit board layout complicated.

SUMMARY OF THE INVENTION

In one aspect of the invention, the present disclosure provides a memory card connector which incorporates a radio communication module to enable a printed circuit board to access an external device via radio communication, and which uses an existing circuit pattern of a card slot on the printed circuit board to connect the radio communication module thereto, instead of a discrete independent circuit pattern of the radio communication module.

In an embodiment of the invention which solves or reduces one or more of the above-mentioned problems, the present disclosure provides a memory card connector which is mounted on a printed circuit board, the memory card connector including: a radio-communication module; and a card slot arranged with input/output terminals that are connected to the printed circuit board, wherein input/output terminals of the radio-communication module are arranged to join the input/output terminals of the card slot, such that the radio-communication module enables the printed circuit board to access an external device via radio communication in a manner equivalent to a manner when the printed circuit board accesses a memory card attached to the card slot.

Other objects, features and advantages of the invention will become more apparent from the following detailed descriptions when read in conjunction with the accompanying drawings.

DETAILED DESCRIPTION OF THE PREFERRED EMBODIMENTS

A description will be given of embodiments of the invention with reference to the accompanying drawings.

Figure 1:
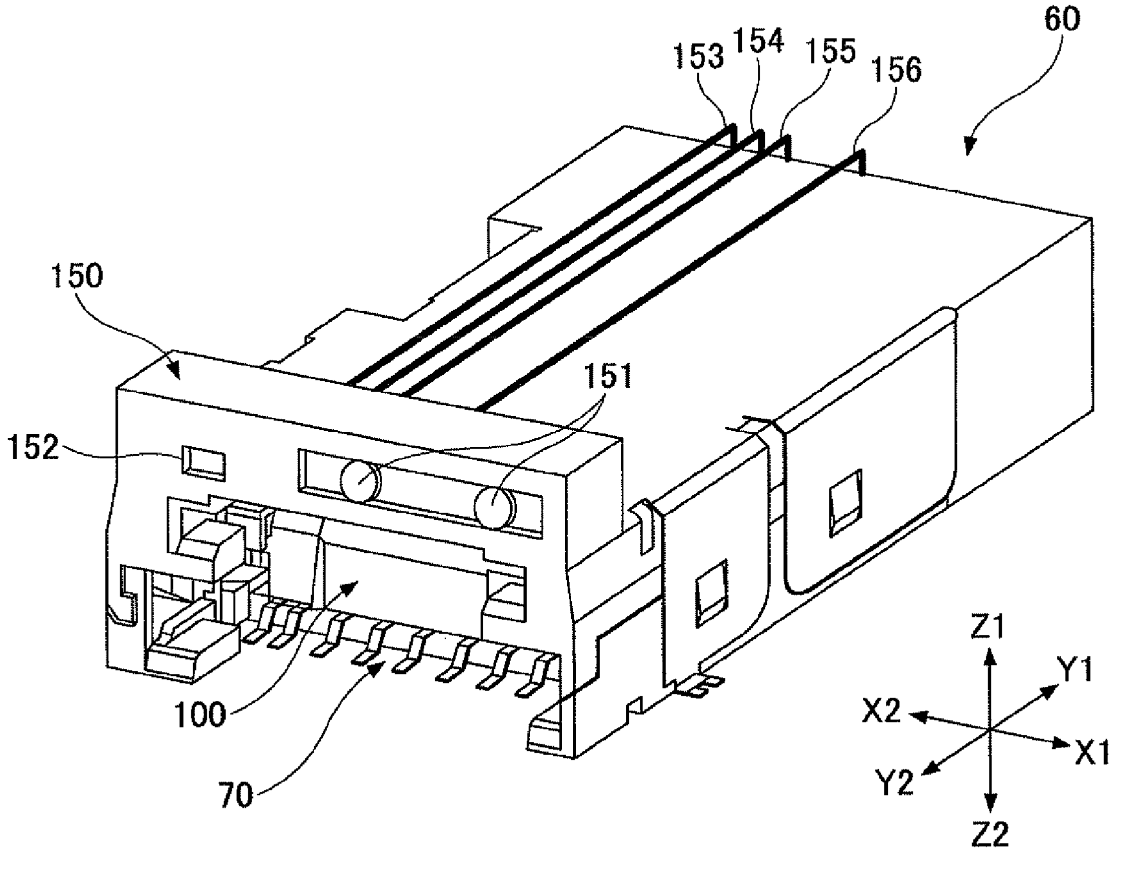
FIG. 1 is a perspective view of a front face of a memory card connector of an embodiment of the invention.
Figure 2:
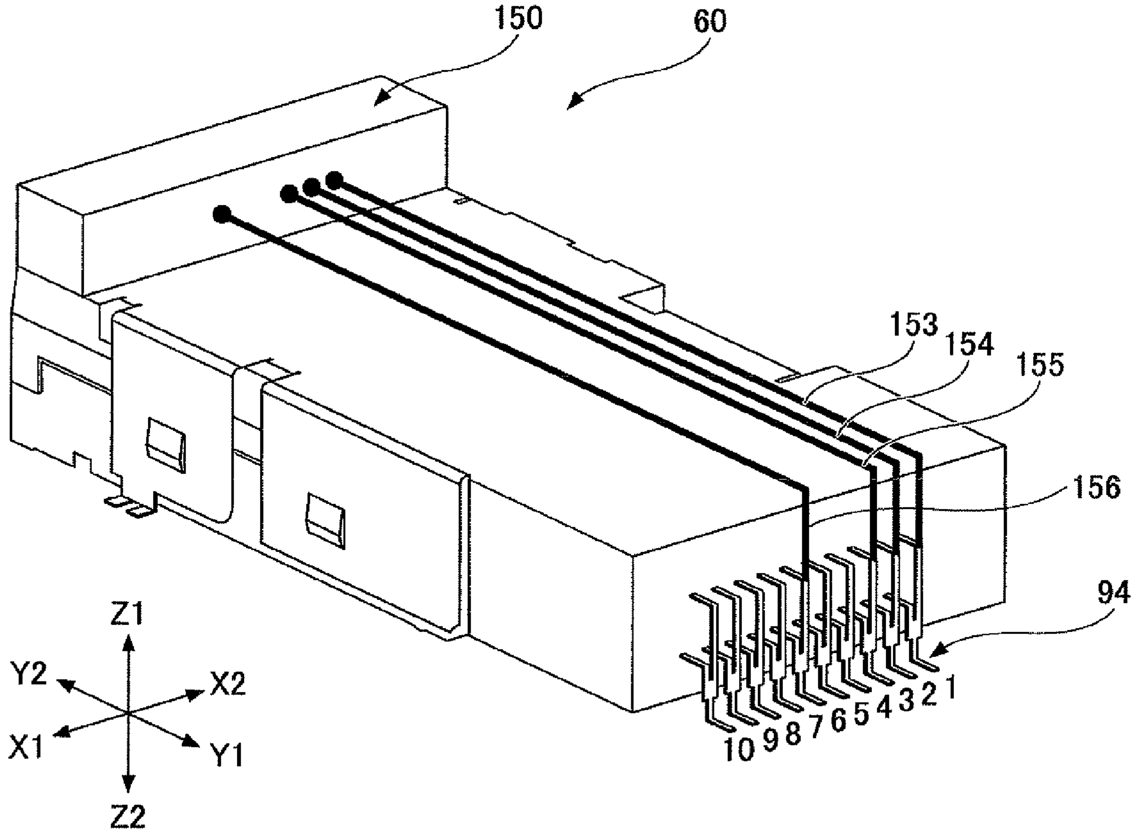
FIG. 2 is a perspective view of a back face of the memory card connector of the present embodiment.
Figure 3:
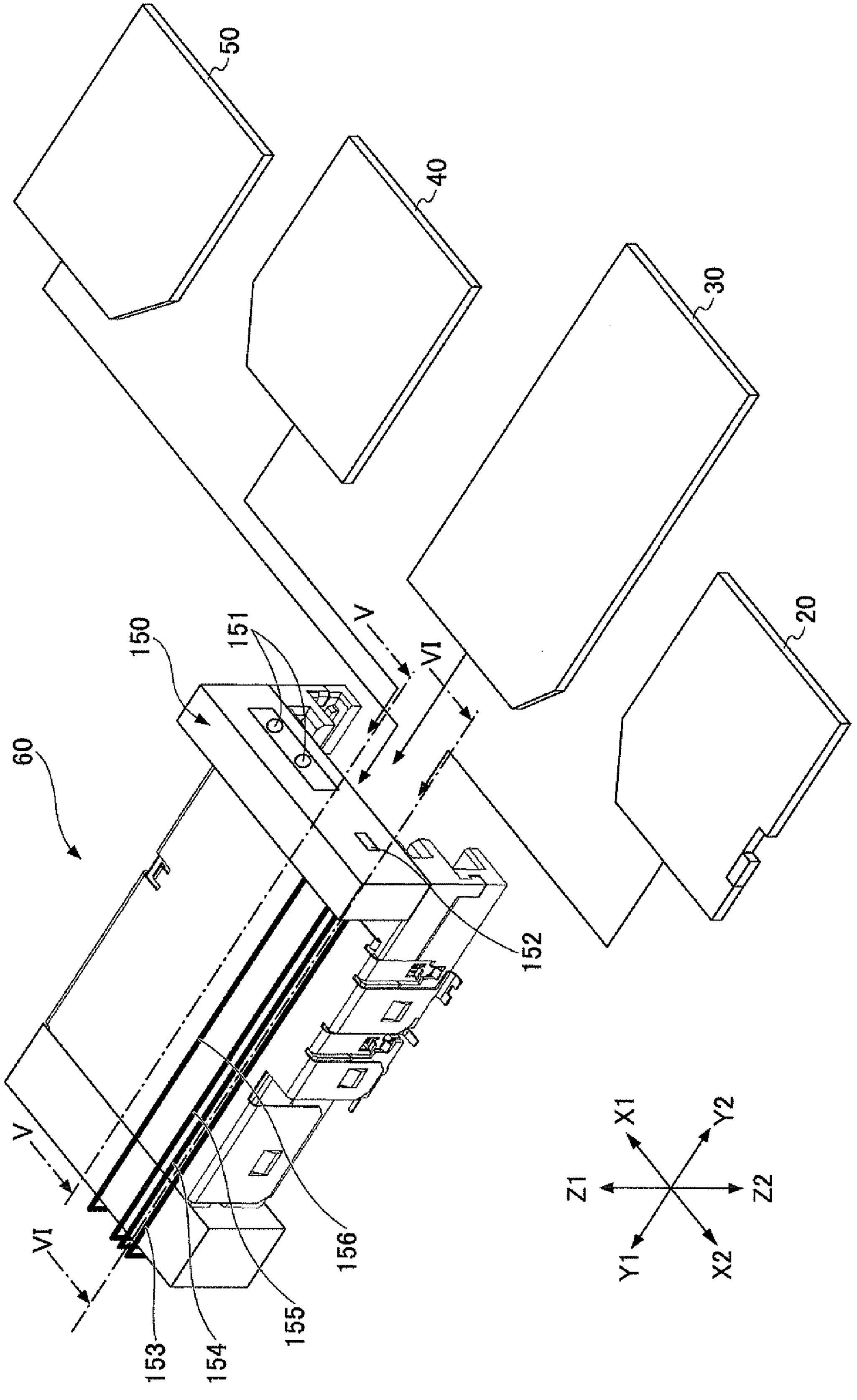
FIG. 3 is a perspective view of the memory card connector of the present embodiment for explaining the relationship between the memory card connector and a plurality of memory cards.
Figure 4:
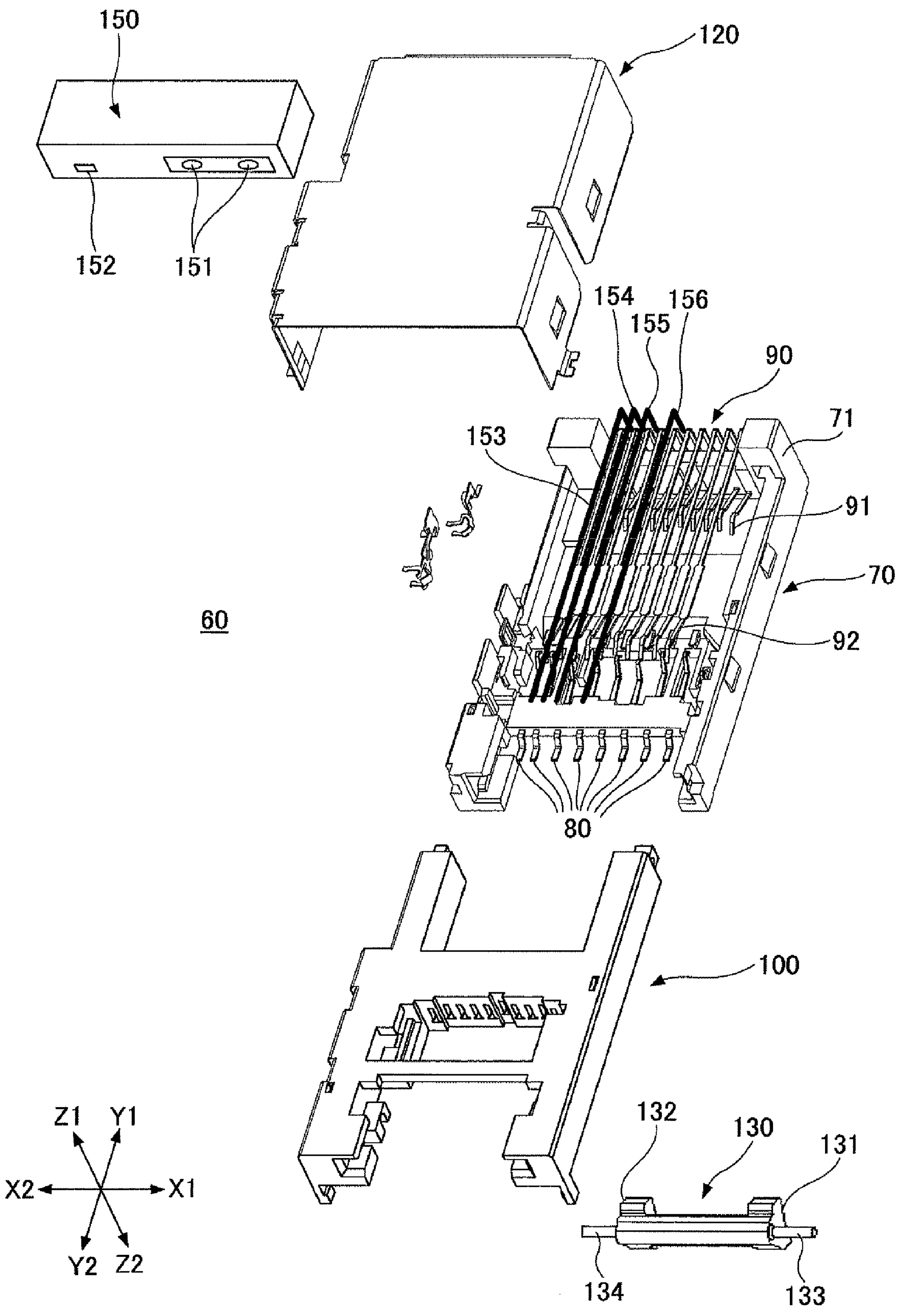
FIG. 4 is an exploded perspective view of the memory card connector of the present embodiment.
Figure 5:
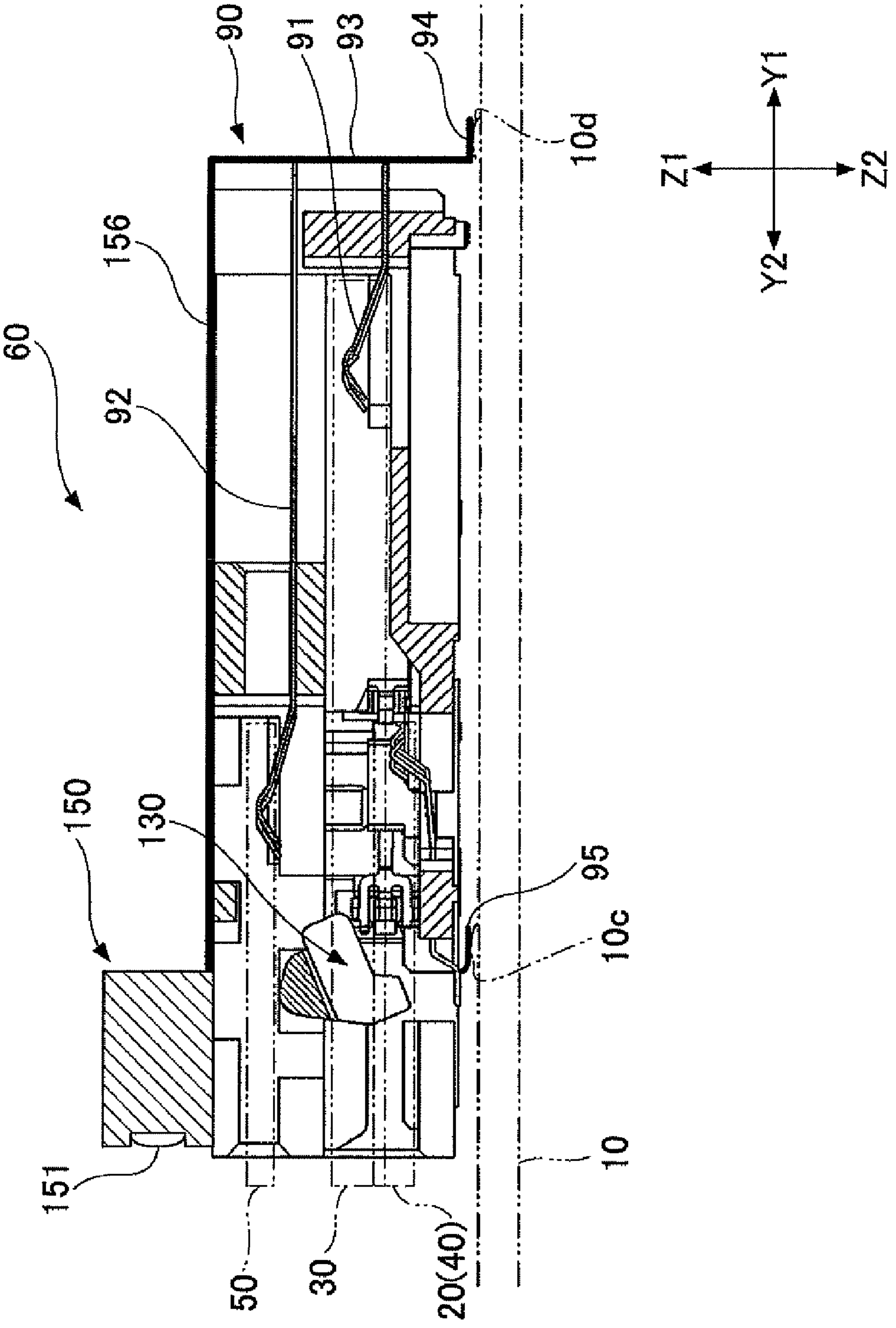
FIG. 5 is a cross-sectional view of the memory card connector of the present embodiment taken along the line V-V indicated in FIG. 3.
Figure 6:
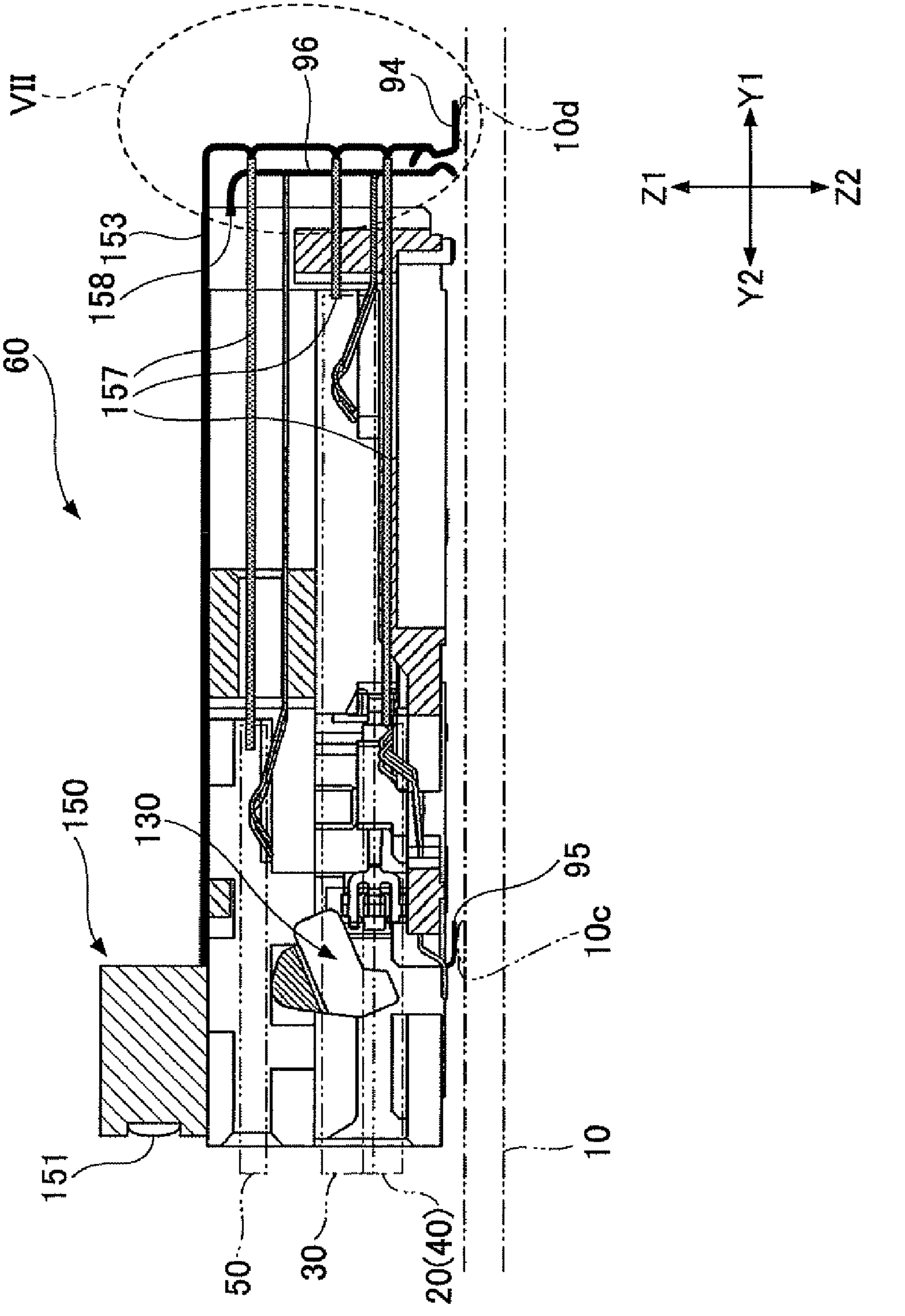
FIG. 6 is a cross-sectional view of the memory card connector of the present embodiment taken along the line VI-VI indicated in FIG. 3.

FIG. 1 is a perspective view of a front face of a memory card connector 60 of an embodiment of the invention. FIG. 2 is a perspective view of a back face of the memory card connector 60 of this embodiment. FIG. 3 is a perspective view of the memory card connector 60 of this embodiment for explaining the relationship between card slots of the memory card connector 60 and memory cards 20, 30, 40 and 50. FIG. 4 is an exploded perspective view of the memory card connector 60 of this embodiment. FIG. 5 is a cross-sectional view of the memory card connector 60 of this embodiment taken along the line V-V indicated in FIG. 3. FIG. 6 is a cross-sectional view of the memory card connector 60 of this embodiment taken along the line VI-VI indicated in FIG. 3.

In FIGS. 1 to 6, the arrows X1, X2 denote the width directions of the memory card connector 60, the arrows Y1, Y2 denote the longitudinal directions of the memory card connector 60, and the arrows Z1, Z2 denotes the thickness (height) directions of the memory card connector 60.

The memory card connector 60 of this embodiment generally includes a radio-communication module 150, a lower-stage housing module 70, an upper-stage housing module 100 mounted on the top surface of the lower-stage housing module 70, and a cover member 120 for covering the lower-stage housing module 70 and the upper-stage housing module 100.

The lower-stage housing module 70 includes a card slot to which one of an SD Memory Card® 20, a Memory Stick® 30, and a Multimedia Card® 40 is selectively attachable. The upper-stage housing module 100 include a card slot to which a Memory Stick Duo® 50 is attachable.

As illustrated in FIG. 4, the lower-stage housing module 70 is an insert molding component which is produced by insert molding. In the lower-stage housing module 70, single contact members 80 having ten contacts and double contact members 90 having ten pairs of contacts (20 pieces in total) are inserted in a lower-stage housing body 71 of a synthetic resin. For the sake of convenience, only eight single contact members 80 and eight double contact members 90 are illustrated in FIG. 4. Each of the double contact members 90 includes a contact arm part 91 and a contact arm part 92.

Each of the contact members 80 is coupled to a lead terminal 95, and the lead terminal 95 is connected to a pad 10*c* on a printed circuit board 10. The contact members 80 correspond to both the terminals of the SD memory card 20 and the terminals of the multimedia card 40.

The double contact members 90 include ten short contact arm parts 91 and ten long contact arm parts 92. Except for a pair of source-voltage contact arm parts (which are located at end portions on the X2 side), the contact arm parts 91 and 92 of the double contact members 90 are arranged to join base parts 93 as illustrated in FIG. 5. Each of the base parts 93 is coupled to a lead terminal part 94, and the lead terminal 94 is connected to a pad 10*d* on the printed circuit board 10. It is assumed that the pads 10*c* and the pads 10*d* are electrically coupled to the integrated circuit (not illustrated) on the printed circuit board 10.

The contact arm parts 91 correspond to the terminals of the memory stick 30, and the contact arm parts 92 correspond to the terminals of the memory stick Duo 50. The connection between the pair of source-voltage contact arm parts and the lead terminals 94 will be described later.

In this embodiment, the contact members 80 and the double contact members 90 constitute input/output terminals of the card slot of each of the lower-stage housing module 70 and the upper-stage housing module 100.

Furthermore, in the memory card connector 60 of this embodiment, an erroneous-card insertion prevention member 130 is provided as illustrated in FIG. 4. The erroneous-card insertion prevention member 130 is a component for preventing two memory cards from being inserted into the two card slots simultaneously. For example, the erroneous-card insertion prevention member 130 includes triangular parts 131 and 132 at the ends thereof, and shafts 133 and 134 which project from the triangular parts 131 and 132 respectively are disposed to extend in the X1 and X2 directions respectively.

Referring to FIG. 5, operation of the erroneous-card insertion prevention member 130 will now be described. If one of the SD memory card 20, the memory stick 30, and the multimedia cards 40 is inserted into the card slot of the lower-stage housing module 70, the erroneous-card insertion prevention member 130 functions as follows. By the incoming memory card, the lower portions of the triangular parts 131 and 132 are pushed in the Y1 direction and rotated counterclockwise around the shafts 133 and 134. The triangular parts 131 and 132 in this condition are disposed to block the card slot of the upper-stage housing module 100. Hence, the erroneous-card insertion prevention member 130 prevents insertion of the memory stick Duo 50 into the card slot of the upper-stage housing module 100.

On the other hand, if the memory stick Duo 50 is inserted into the card slot of the upper-stage housing module 190, the erroneous-card insertion prevention member 130 functions as follows. By the incoming memory stick Duo 50, the upper portions of the triangular parts 131 and 132 are pushed in the Y1 direction and rotated clockwise around the shafts 133 and 134. The triangular parts 131 and 132 in this condition are disposed to block the card slot of the lower-stage housing module 70. Hence, the erroneous-card insertion prevention member 130 prevents insertion of one of the SD memory card 20, the memory stick 30, and the multimedia card 40 into the card slot of the lower-stage housing module 70.

The radio-communication module 150 is a radio-communication interface unit that enables the memory-card connector 60 to communicate with an external device via radio communication. For example, the radio-communication module 150 may be an infrared-ray-communication module in conformity with the IrDA (Infrared Data Association) standard requirements. The radio-communication module 150 includes a transmission/reception part 151, an operating-state indication LED 152, and a signal converting part (not illustrated). The transmission/reception part 151 includes an LED (light emitting diode) for transmitting a signal to an external device and a photo diode for receiving a signal from an external device. The operating-state indication LED 152 displays an operating state of the radio-communication module 150. The signal converting part (not illustrated) converts an IrDA signal into a signal in conformity with the memory card standard requirements.

As illustrated in FIG. 2, the radio-communication module 150 includes four terminals on the back face which is located on the Y1 side, and four L-shaped contact members. The four L-shaped contact members of the radio-communication module 150 extend from the terminals of the radio-communication module 150 in the Y1 direction and are folded down to the double contact members 90, respectively. Specifically, the contact members of the radio-communication module 150 are: a source voltage contact member 153 (which is arranged to join a first contact in the double contact members 90), a data transmission contact member 154 (which is arranged to join a second contact in the double contact members 90), a data reception contact member 155 (which is arranged to join a third contact in the double contact members 90), and a ground voltage contact member 156 (which is arranged to join a sixth contact in the double contact members 90) as illustrated in FIG. 2.

In this embodiment, the contact members 153-156 constitute input/output terminals of the radio-communication module 150.

It is assumed that a source voltage pad, a data transmitting pad, a data receiving pad, and a ground voltage pad on the back surface (on the Z2 side) of the memory card, which is inserted in the memory card connector 60 of this embodiment, correspond to the first contact, the second contact, the third contact, and the sixth contact of the single contact members 80 and the double contact members 90, respectively.

As illustrated in FIG. 5, the data transmission contact member 154, the data reception contact member 155, and the ground voltage contact member 156 are arranged to join the base parts 93 of the double contact members 90, and are connected to the lead terminals 94 through the base parts 93.

On the other hand, as illustrated in FIG. 6, the source voltage contact member 153 is arranged not to join a base part 96 of a corresponding one of the double contact members 90. Rather, the source voltage contact member 153 is arranged to join a source voltage switching part (which will be described later) and is connected to the lead terminal 94 via the source voltage switching part. The source voltage switching part is arranged to supply the source voltage selectively to one of the radio-communication module 150 and the card slots (the lower-stage housing module 70 and the upper-stage housing module 100).

Figure 7A:
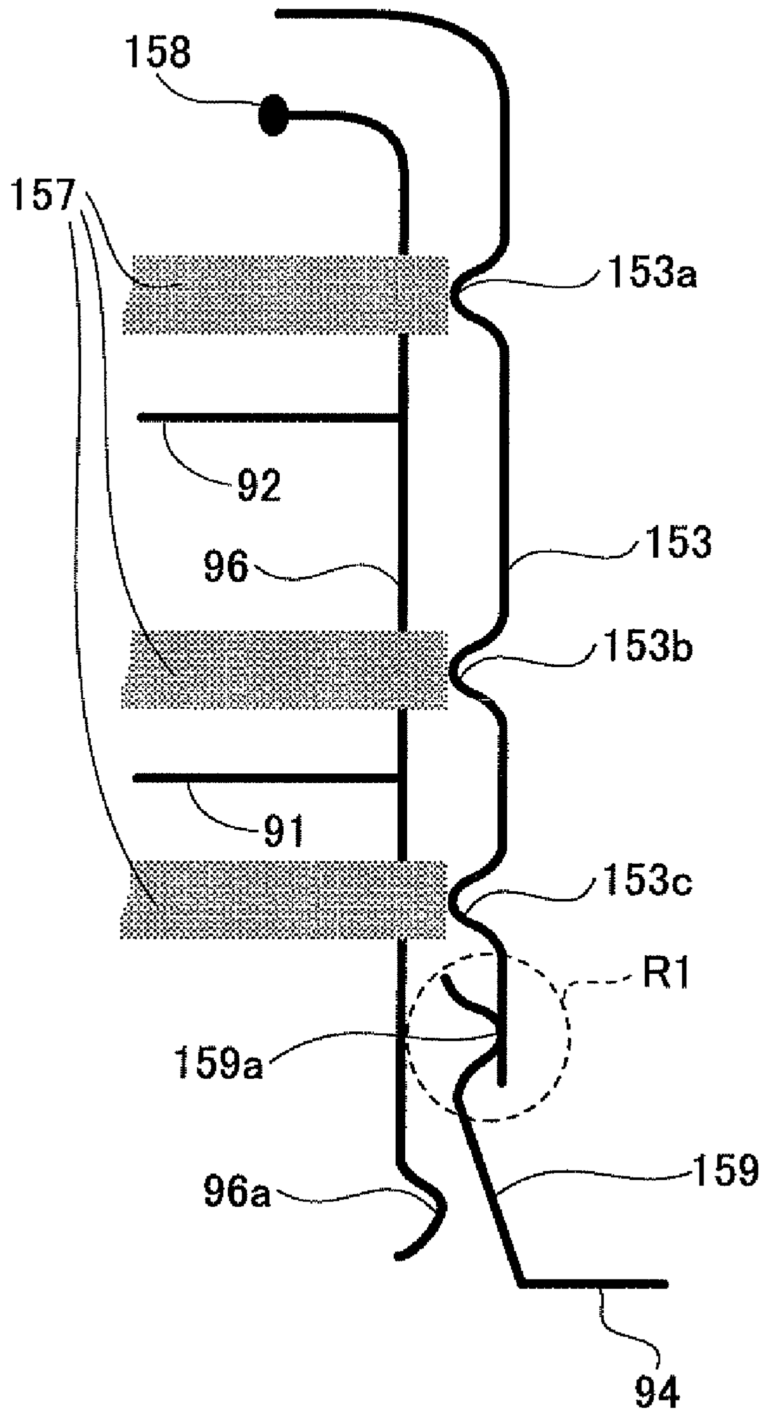
FIG. 7A and FIG. 7B are diagrams for explaining a source voltage switching part.
Figure 7B:
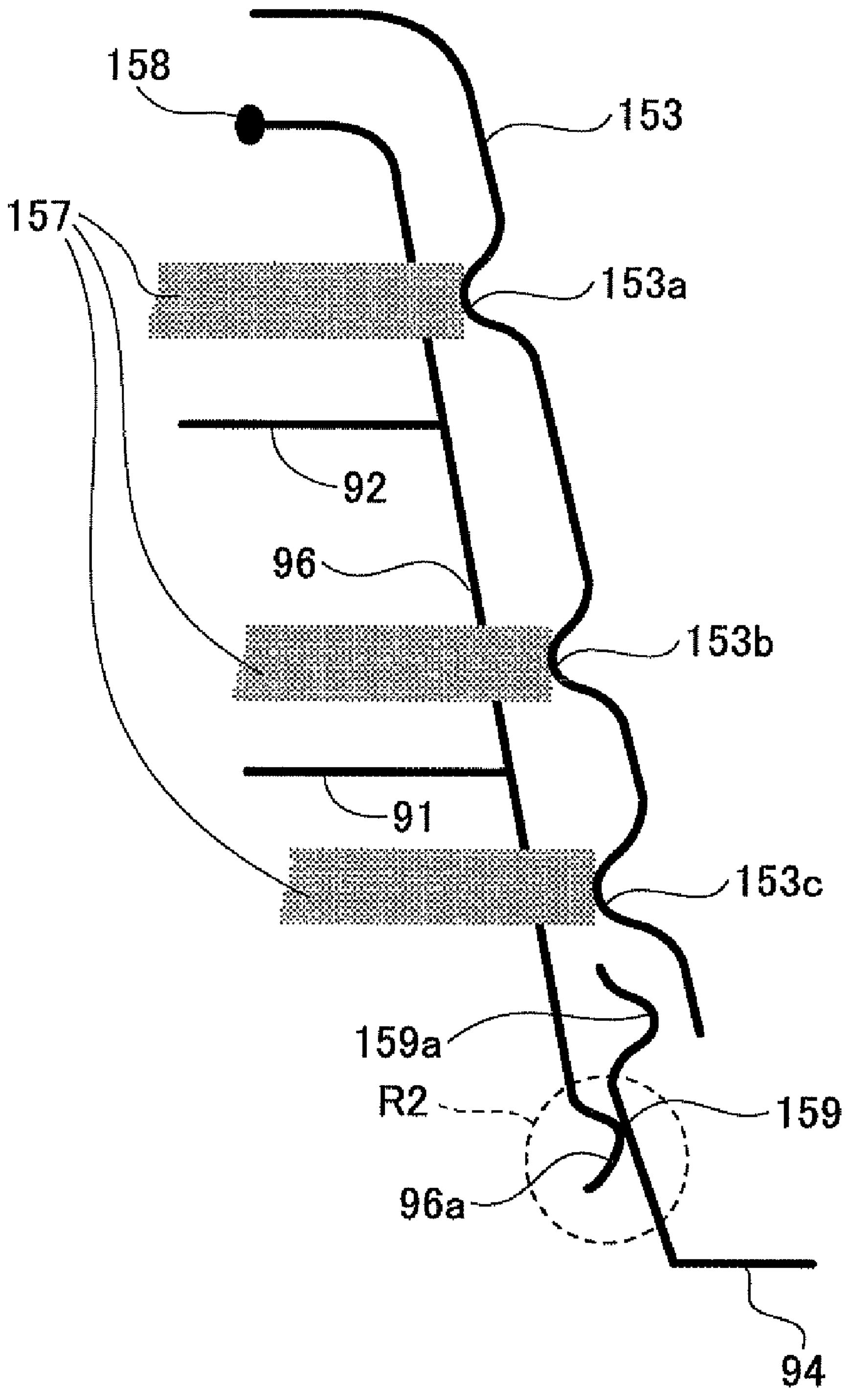

Referring to FIG. 6, FIG. 7A and FIG. 7B, a description will be given of the source voltage switching part in the memory card connector 60 of this embodiment.

FIG. 7A and FIG. 7B are enlarged views of the portion of the memory card connector 60 of this embodiment indicated by the dotted line VII in FIG. 6. FIG. 7A illustrates the state of the portion of the memory card connector 60 wherein no memory card is attached to the card slots and the source voltage is supplied to the radio-communication module 150. FIG. 7B illustrates the state of the portion of the memory card connector 60 wherein a memory card is attached to one of the card slots and the source voltage is supplied to the card slot to which the memory card is attached.

As illustrated in FIG. 6, the source voltage switching part includes three switching insulators 157. The switching insulators 157 in this embodiment are rod-like insulation members. When a memory card is inserted into one of the card slots of the lower-stage housing module 70 and the upper-stage housing module 100, the Y1-side end of the memory card pushes a corresponding one of the switching insulators 157 in the Y1 direction (or the insertion direction). The corresponding switching insulator 157 slides in the Y1 direction by the movement of the memory card.

The source voltage contact member 153 includes three projections 153*a*, 153*b* and 153*c* which project in the Y2 direction. The switching insulators 157 are arranged to contact the projections 153*a*, 153*b* and 153*c* at the other ends respectively. Each of the switching insulators 157 is coupled to the base part 96 in which the first contact of the corresponding one of the double contact members 90 is disposed.

The base part 96 in which the first contact of the corresponding double contact member 90 is disposed includes a contact holding part 158 at its fixed end, which is secured to the upper-stage housing module 100, and includes a projection 96*a* at its free end, which projects in the Y1 direction. When the corresponding switching insulator 157 slides in the Y1 direction, the base part 96 is rotated counterclockwise around the contact holding part 158 as a fulcrum.

As illustrated in FIG. 7A, when no memory card is inserted in the card slots of the lower-stage housing module 70 and the upper-stage housing module 100, the free end of the source voltage contact member 153 is in contact with a projection 159*a* (which projects in the Y1 direction) of a lead terminal extension portion 159 extending upward from the lead terminal 94, as in the region indicated by the dotted line R1 in FIG. 7A. Hence, the source voltage switching part supplies the source voltage to the radio-communication module 150.

On the other hand, as illustrated in FIG. 7B, when a memory card is attached to one of the card slots of the lower-stage housing module 70 and the upper-stage housing module 100, the switching insulator 157 pushes one of the projections 153*a*, 153*b* and 153*c* of the supply voltage contact member 153 in the Y1 direction. Hence, the electrical connection between the free end of the supply voltage contact member 153 and the projection 159*a* of the lead terminal extension portion 159 is canceled.

At this time, similar to the source voltage contact member 153, the base part 96 of the double contact member 90 is pushed in the Y1 direction because the switching insulators 157 are coupled to the base part 96 of the double contact member 90. The base part 96 of the double contact member 90 is rotated counterclockwise around the contact holding part 158 as a fulcrum, and the projection 96*a* is brought in contact with the lead terminal extension portion 159, as in the region indicated by the dotted line R2 in FIG. 7B. Hence, the source voltage switching part supplies the source voltage to the corresponding one of the lower-stage housing module 70 and the upper-stage housing module 100 to which the memory card is attached.

When the memory card is detached from the lower-stage housing module 70 or the upper-stage housing module 100, the base part 96 of the double contact member 90 and the source voltage contact member 153 are returned to the state of FIG. 7A by the reactive action while the switching insulators 157 slides in the Y2 direction.

The state indication LED 152 is to display the operating state of the radio-communication module 150. For example, when data is received from an external device via radio communication, the state indication LED 152 emits a red light, and when data is transmitted to an external device via radio communication, the state indication LED 152 emits a green light.

The memory card connector 60 of this embodiment is mounted on the printed circuit board 10 so that it is incorporated in electronic equipment, such as a digital camera. The memory card connector 60 is arranged in the electronic equipment such that the card slots of the lower-stage housing module 70 and the upper-stage housing module 100 and the transmission/reception part 151 and the operating-state indication LED 152 of the radio-communication module 150 are exposed to the outside of the electronic equipment.

The memory card connector 60 of this embodiment does not require a discrete independent circuit pattern of the radio-communication module 150 on the printed circuit board 10 for connecting the radio-communication module 150 to the printed circuit board 10. The memory card connector 60 of this embodiment incorporates the radio-communication module 150 to enable the printed circuit board 10 to carry out the radio communications between the printed circuit board 10 and an external device. It is possible to eliminate the burden of development of an apparatus carrying the printed circuit board 10 and incorporating a additional radio-communication function, and it is possible to improve flexibility of circuit patterns and arrangement of components.

The memory card connector 60 of this embodiment enables addition of a radio-communication function to an existing printed circuit board which uses a memory card connector of the related art which does not incorporate a radio-communication module. The memory card connector 60 of this embodiment enables the printed circuit board with the added radio-communication function to access an external device via radio communication in a manner equivalent to when the printed circuit board access a memory card which is attached to the memory card connector 60.

In the memory card connector 60 of this embodiment, the source voltage switching part prevents the source voltage from being supplied simultaneously to both the radio-communication module 150 and the corresponding one of the lower-stage housing module 70 and the upper-stage housing module 100. It is possible to prevent the printed circuit board to read data simultaneously from both the memory card attached to the card slot and the external device connected to the radio communication module 150 via radio communication. It is possible to prevent the printed circuit board from writing data simultaneously to both the memory card attached to the card slot and the external device connected to the radio communication module 150 via radio communication.

As described in the foregoing, according to the embodiments of the invention, it is possible to provide a memory card connector which incorporates a radio communication module to enable a printed circuit board to access an external device via radio communication and which uses an existing circuit pattern of a card slot on the printed circuit board to connect the radio communication module thereto, instead of a discrete independent circuit pattern of the radio communication module.

The present invention is not limited to the specifically disclosed embodiments, and variations and modifications may be made without departing from the scope of the present invention.

For example, the memory card connector 60 of the above-described embodiment is arranged so that one of the four memory cards of different kinds can be attached to the memory card connector 60. Alternatively, the memory card connector of another embodiment of the invention may be arranged to include the radio-communication module 150 and a single card slot to which a single memory card is detachably attached.

The memory card connector 60 of the above-described embodiment is arranged to use the source voltage switching part for selectively switching the source voltage contact member 153 only. Alternatively, an additional source voltage switching part may be arranged for any of the data transmission contact member 154, the data reception contact member 155, and the ground voltage contact member 156, in addition to the source voltage switching part for the source voltage contact member 153.

The memory card connector 60 of the above-described embodiment is arranged so that the source voltage switching part performs mechanically switching of the part to which the source voltage is supplied, in response to the attachment of the memory card to the card slot. Alternatively, the memory card connector of the invention may be arranged to use an electric unit (for example, a semiconductor switch) perform switching of the part to which the source voltage is supplied, after the attachment of the memory card to the card slot is detected mechanically or electrically.

The memory card connector 60 of the above-described embodiment employs an infrared-ray communication module in conformity with the IrDA standard requirements as the radio-communication module 150. Alternatively, the memory card connector of the invention may be arranged to use a radio-communication module in conformity with other radio-communication standard requirements, such as Bluetooth, Wireless-USB, ZigBee, etc.

The present application is based on Japanese priority application No. 2008-203311, filed on Aug. 6, 2008, the contents of which are incorporated herein by reference in their entirety.

What is claimed is:

1. A memory card connector which is mounted on a printed circuit board, comprising:
  - a card slot in which a memory card is inserted, the card slot including first input/output terminals that are connected to the printed circuit board, each of the first input/output terminals including a contact arm disposed within the card slot and being connectable to a connector off the memory card inserted, a terminal part connected to one of pads provided on the printed circuit board, and a base part positioned between the contact arm and the terminal part, respectively;
  - a radio-communication module including second input/output terminals, each of the second input/output terminals being arranged to join the base part of one of the first input/output terminals; and
  - a source voltage switching part that supplies a source voltage selectively to one of the radio-communication module and the card slot, wherein the source voltage switching part
    - supplies the source voltage to the radio-communication module when a memory card is not attached to the card slot, and
    - supplies the source voltage to the card slot and cancels supply of the source voltage to the radio-communication module when a memory card is attached to the card slot.

2. The memory card connector according to claim 1, wherein each of the second input/output terminals includes a contact member which is arranged to join a corresponding one of the base parts of the first input/output terminals.

3. A memory card connector which is mounted on a printed circuit board, the memory card connector comprising:
  - a card slot in which a memory card is inserted, the card slot including first input/output contacts and a first voltage contact for supplying a source voltage to the card slot, each first input/output contact including a contact arm disposed within the card slot and being connectable to a contact of the memory card, a terminal part connected to one of pads provided on the printed circuit board, and a base part positioned between the contact arm and the terminal part;
  - a radio-communication module including second input/output contacts and a second voltage contact for supplying the source voltage to the radio-communication module, each second input/output contact being joined to the base part of one of the first input/output contacts; and
  - a switch connected to a pad of the printed circuit board for supplying the source voltage, the switch selectively connected to one of the first voltage contact and the second voltage contact, wherein the switch is connected to the first voltage contact when the memory card is inserted in the card slot, and the switch is connected to the second voltage contact when the memory card is not inserted in the card slot.

* * * * *